United States Patent
Leblanc

(10) Patent No.: US 9,166,775 B2
(45) Date of Patent: Oct. 20, 2015

(54) CROSS-CHANNEL DATA COMMUNICATION WITH DATA PHASE-LOCKED LOOP

(71) Applicant: Hamilton Sundstrand Corporation, Charlotte, NC (US)

(72) Inventor: Paul J. Leblanc, Thomaston, CT (US)

(73) Assignee: Hamilton Sundstrand Corporation, Charlotte, NC (US)

( * ) Notice: Subject to any disclaimer, the term of this patent is extended or adjusted under 35 U.S.C. 154(b) by 0 days.

(21) Appl. No.: 14/153,294

(22) Filed: Jan. 13, 2014

(65) Prior Publication Data

US 2015/0200769 A1    Jul. 16, 2015

(51) Int. Cl.
   *H03D 3/24*     (2006.01)
   *H04L 7/033*    (2006.01)
   *H03L 7/089*    (2006.01)

(52) U.S. Cl.
   CPC ............. *H04L 7/0331* (2013.01); *H03L 7/0891* (2013.01); *H04L 7/033* (2013.01)

(58) Field of Classification Search
   CPC .............................. H04L 7/033; H03L 7/0891
   USPC ........................................................ 375/376
   See application file for complete search history.

(56) References Cited

U.S. PATENT DOCUMENTS

| | | | | |
|---|---|---|---|---|
| 3,840,821 A * | 10/1974 | Conway | .......................... | 331/14 |
| 5,168,511 A | 12/1992 | Boles | | |
| 5,271,040 A * | 12/1993 | Clark | ............................. | 375/327 |
| 5,952,888 A * | 9/1999 | Scott | ................................. | 331/2 |
| 6,901,127 B1 * | 5/2005 | Margules | ...................... | 375/361 |
| 2006/0192622 A1 * | 8/2006 | Narita | .............................. | 331/16 |
| 2006/0279438 A1 * | 12/2006 | Kishi et al. | ..................... | 341/51 |
| 2008/0170028 A1 * | 7/2008 | Yoshida | ........................ | 345/100 |
| 2013/0200838 A1 * | 8/2013 | Seki et al. | ..................... | 318/632 |
| 2014/0225635 A1 * | 8/2014 | Dasnurkar | ................. | 324/750.3 |
| 2014/0266342 A1 * | 9/2014 | Arai et al. | ..................... | 327/156 |
| 2015/0023458 A1 * | 1/2015 | Ngo | ............................. | 375/361 |

OTHER PUBLICATIONS

Extended European Search Report dated May 27, 2015, for corresponding European Application No. 15150792.8.

* cited by examiner

*Primary Examiner* — Santiago Garcia
(74) *Attorney, Agent, or Firm* — Kinney & Lange, P.A.

(57) ABSTRACT

A data communication system includes a unit that receives edge-encoded data from a data link. The unit includes a counter, a data bit reader, and a phase-locked loop. The counter counts at a sampling frequency between a minimum value and an end-count value. The data bit reader is connected to receive the edge-encoded data. The data bit reader samples the edge-encoded data at the sampling frequency to detect data bits of the edge-encoded data. The phase-locked loop updates the end-count value if consecutive bits of the data bits are detected prior to an expected iteration of the counter. The phase-locked loop also updates the end-count value if consecutive bits of the data bits are detected later than the expected iteration of the first counter.

16 Claims, 3 Drawing Sheets

CROSS-CHANNEL DATA COMMUNICATION WITH DATA PHASE-LOCKED LOOP

BACKGROUND

The present invention is related to data communication, and in particular to a system and method for cross-channel data link communication.

In critical systems, such as those onboard aircraft, redundant units are often utilized to protect against failures and verify input and output data. The redundant units may communicate shared data with one another in order to verify the integrity of the data. These systems are often asynchronous systems in which each unit includes its own oscillator. Because of this, in order to ensure data integrity, data must be sampled at a high oversample rate. This limits the speed at which data can be communicated between the units. It is desirable to limit the oversample rate in order to provide greater speed for the data communication between the redundant units.

SUMMARY

A data communication system includes a unit that receives edge-encoded data from a data link. The unit includes a counter, a data bit reader, and a phase-locked loop. The counter counts at a sampling frequency from a minimum value and an end-count value. The data bit reader is connected to receive the edge-encoded data. The data bit reader samples the edge-encoded data at the sampling frequency to detect data bits of the edge-encoded data. The phase-locked loop updates the end-count value if consecutive bits of the data bits are detected prior to an expected iteration of the counter. The phase-locked loop also updates the end-count value if consecutive bits of the data bits are detected later than the expected iteration of the first counter.

DETAILED DESCRIPTION

A system and method for communicating data on a cross-channel data link includes multiple redundant units that each include a data bit reader, a counter, and a phase-locked loop. The units each include processing units such as, for example, field programmable gate-arrays (FPGAs). The units are connected to one another through a cross-channel data link (CCDL). Each FPGA includes a data transmitter that produces edge-encoded data on the CCDL for the other units, and a data bit reader that receives the edge-encoded data from the other units on the CCDL. Each FPGA also includes a counter and a phase-locked loop (PLL). For each unit, the counter increments at an oversample frequency and loops each time the counter reaches an end-count value. The data bit reader samples data at each iteration of the counter. The data on the CCDL is encoded using, for example, Manchester encoding and thus, data bits are received by detecting an edge transition on the CCDL. When synchronized, the edge transitions that represent data bits are detected at an expected iteration of the counter such as, for example, the third iteration. If data bits are detected earlier than expected or later than expected for consecutive data bits, the PLL adjusts the end-count value for the current data bit accordingly so that the following data bits are once again detected at the expected iteration. By utilizing the PLLs in this way, clock drift between the units may be accounted for. This allows the data to be oversampled at a lower rate than the prior art, which in turn allows the data to be transmitted at a faster rate.

Figure 1:
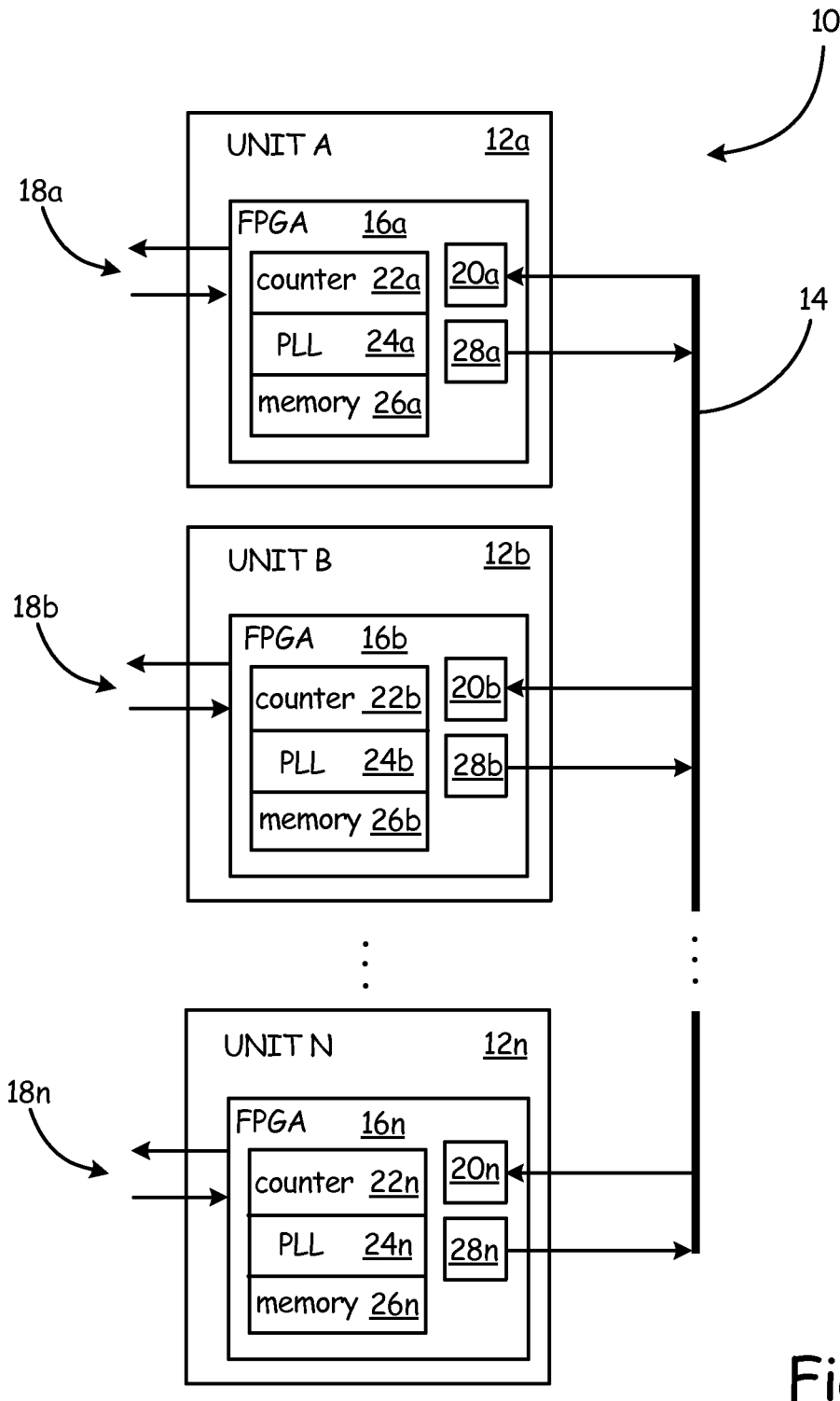
FIG. 1 is a system diagram illustrating multiple units each utilizing a phase-locked loop for cross-channel data link communication.

FIG. 1 is a system diagram illustrating multiple units that each utilize a data phase-locked loop (PLL) for cross-channel data link (CCDL) communication. System 10 includes units 12a-12n and CCDL 14. Each of units 12a-12n include respective field-programmable gate arrays (FPGAs) 16a-16n, and primary input/output interfaces 18a-18n. Each FPGA 16a-16n includes respective data bit readers 20a-20n, counters 22a-22n, phase-locked loops (PLLs) 24a-24n, internal memory units 26a-26n, and transmitters 28a-28n. In other embodiments, FPGAs 16a-16n may be implemented as any type of digital logic circuit. System 10 may be any electronic system that includes redundant units, such as critical systems onboard an aircraft.

Figure 2:
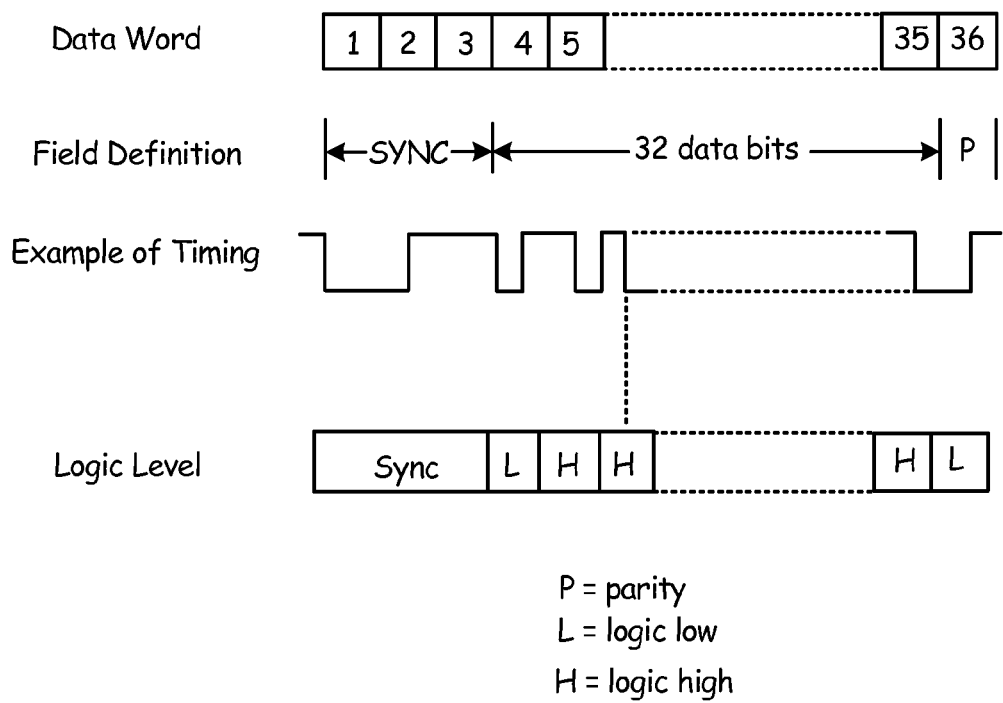
FIG. 2 is a chart illustrating an embodiment of data transmitted on a cross-channel data link.

CCDL 14 includes one transmit line and one receive line for each pair of units. This allows each pair of units 12a-12n to communicate directly with the other units 12a-12n using a single input pin and a single output pin. For example, if system 10 includes three units, each unit will include two input pins and two output pins. Data may be edge-encoded using, for example, Manchester encoding as illustrated in FIG. 2. Each unit transmits data onto CCDL 14 using transmitters 28a-28n. FPGA 16a encodes data for each of the other units 12b-12n and provides the encoded data to CCDL 14 through transmitter 28a. The data provided to CCDL 14 may be, for example, representative of data received, or data to be transmitted, by unit 12a on primary input/output interface 18a. This data may be provided to the other units 12b-12n so that the other units 12b-12n can verify their respective primary input or output. For example, sensor data may be provided to units 12a-12n on input/output interface 18a-18n. This sensor data may be shared between units 12a-12n on CCDL 14 in order to, for example, verify the sensor data. If calculations are made on the sensor data, each unit 12a-12n may perform the calculation, and then share the result on CCDL 14 for verification prior to providing the result on input/output interface 18a-18n.

Data bit reader 20a receives incoming data on CCDL 14 for unit 12a. This data is, for example, Manchester encoded. Manchester encoding represents data bits based upon transitions between "logic high" and "logic low" on CCDL 14. While the present embodiment is explained using Manchester encoding, any data encoding that utilizes transitions between "logic high" and "logic low" may be utilized.

Counter 22a is utilized to provide over-sampling of the data on CCDL 14. For unit 12a, counter 22a counts between a minimum count and an end-count at a sampling frequency. This frequency is based upon an oscillator of unit 12a. This oscillator may be internal or external to unit 12a. When the counter reaches the end-count, it loops back to the minimum count. The minimum and end-counts may be, for example, zero and five respectively. This provides six sampling iterations. Data is "over-sampled" on CCDL 14 by bit reader 20a at each iteration. For example, if data is seen as "logic low" at iteration one, and is then seen as "logic high" at iteration two, then bit reader 20a reads a "binary zero" data bit. If data is seen as "logic high" at iteration one, and is then seen as "logic low" at iteration two, then bit reader 20a reads a "binary one"

data bit. These data bits may then be stored, for example, within internal memory unit 26a. Memory unit 26a is, for example, static random-access memory (SRAM), dynamic random-access memory, flash memory, or any other type of electronic data storage.

Data bit transitions are expected to be seen once for each set of six iterations of counter 22a. If the oscillator of unit 12a is properly synchronized to the oscillators of the other units 12b-12n, then data bit transitions should be seen, for example, sometime during the third iteration of counter 12a. This means that the data sampled by data bit reader 20a at counter value one should differ from the data sampled by data bit reader 20a at counter value two. Edge transitions not representative of data bits may also occur around the first or final iteration of each loop of the counter. For example, if two "binary ones" are sent consecutively, an edge transition will occur between data bits in order to allow for consecutive "logic high" to "logic low" data bit transitions. These edge transitions may be ignored by unit 12a.

With continued reference to FIG. 1, FIG. 2 is a chart illustrating sample data transmitted on CCDL 14 between units 12a-12n. In the embodiment illustrated in FIG. 2, data is transmitted on CCDL 14 as thirty-six bit data words. The first three "bits" are utilized as a sync pattern. The sync pattern is "logic low" for nine iterations of counter 22a, and then "logic high" for nine iterations. Therefore, if data bit reader 20a sees "logic low" data for an entire six iterations, unit 12 determines that a new data word is being sent. This is verified by seeing a bit transition from "logic low" to "logic high" during the next six iterations, and then seeing all "logic high" data for the following six iterations.

For each incoming data bit that follows the sync pattern, data bit reader 20a expects to detect a data bit transition during the expected iteration of counter 22a which may be, for example, the third iteration. If a data bit transition is one iteration early or one iteration late, PLL 24a may record the early or late transition by, for example, setting a flag bit within unit 12a indicative of either a late or early data bit. If a subsequent data bit transition is also one iteration early or one iteration late, and the flag bit is already set, indicating that the previous data bit was also one iteration early or one iteration late, then PLL 24a adjusts the end-count value of counter 22a to compensate for the detected clock drift. For example, if the expected iteration is two, and the data bit transition for data bit four is seen at counter iteration one, and then the data bit transition for data bit five is also seen at counter iteration one, then PLL 24a subtracts one from the end-count value for this bit cycle. This adjustment allows data bits to once again be detected at the expected iteration. For the following data bit cycle, the end-count value is once again set to the normal value.

The final bit in the data word is a parity bit. This provides further error protection for the incoming data. Unit 12a can perform, for example, a checksum on the received data using the parity bits to further ensure that there has been no data corruption. Although described for unit 12a, all units 12a-12n receive and verify data in a similar way.

Prior art systems did not include PLLs 24a-24n and thus, required a higher oversample rate to ensure that clock drift did not cause data corruption. Data words also needed to be small in size with breaks between transmissions to further ensure that clock drift did not cause data loss or corruption. By introducing PLLs 24a-24n to account for clock drift, data words can be larger in size, can be continuously transmitted one after another, and can be transmitted at a higher rate. For example, if data can be transmitted at two megabits per second at a "12×" oversample rate, then the same data can be transmitted at four megabits per second for a "6×" oversample rate.

The embodiment illustrated in FIGS. 1 and 2 is advantageous over alternative methods of CCDL communication such as universal asynchronous receiver/transmitters (UARTs), inter-integrated circuit (I2C), serial peripheral interface (SPI), small computer system interface (SCSI), or peripheral component interconnect (PCI) that may be implemented. These alternative interfaces may be slow, require several extra pins, or require complex drivers. By using a PLL with edge-encoded data, a single transmit pin and single receive pin may be used to provide CCDL communication for each of the redundant units. This allows faster communication without the need for extra pins or complex communication protocols.

Figure 3:
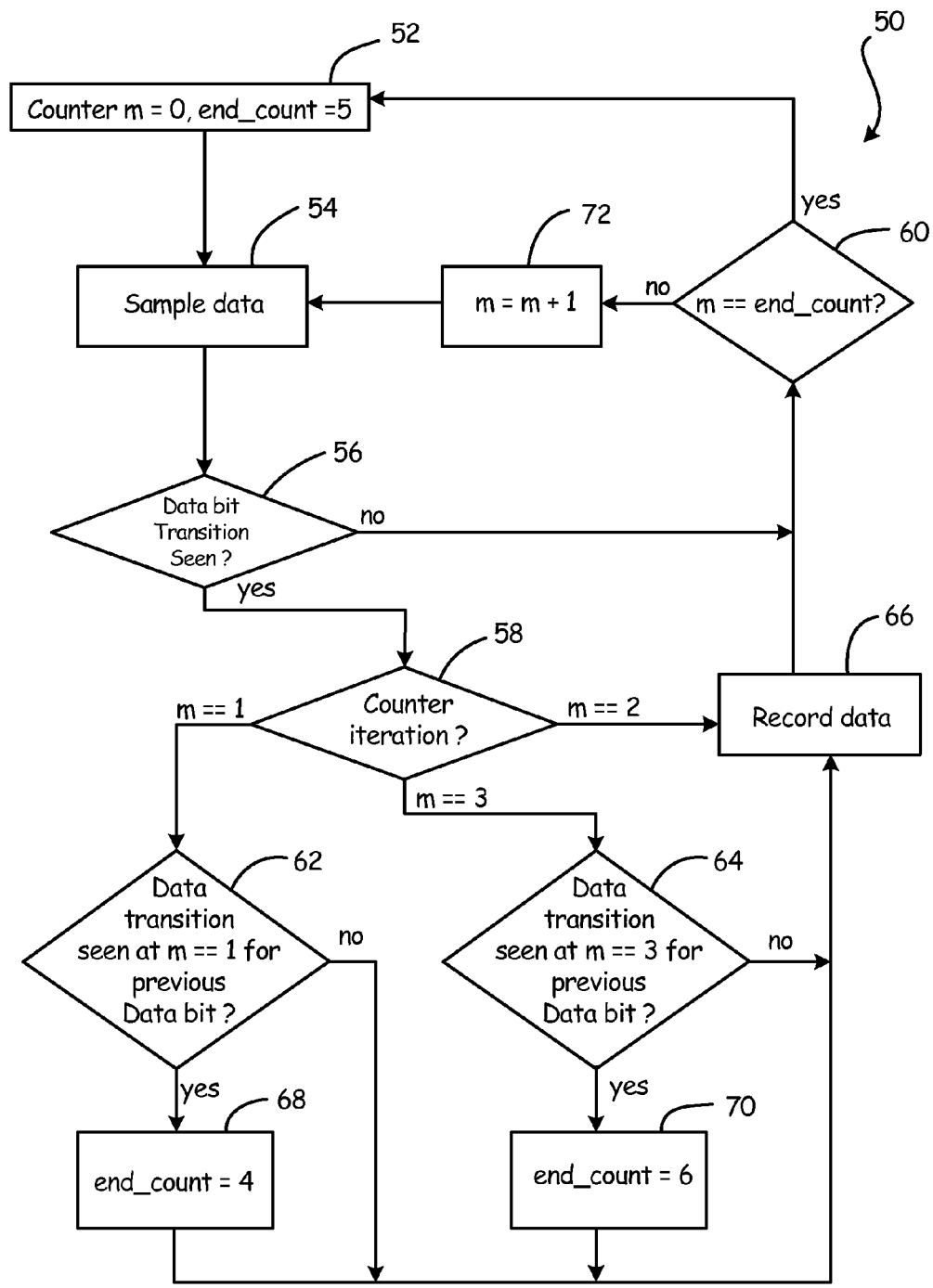
FIG. 3 is a flowchart illustrating a method of receiving data in a system that utilizes cross-channel data link communication.

With continued reference to FIG. 1, FIG. 3 is a flowchart illustrating method 50 of receiving data in a system that utilizes cross-channel data link communication. At step 52, counter 22a is set to zero and the end-count value for counter 22a is set to five. At step 54, data is sampled by bit reader 20a on CCDL 14. At step 56, it is determined if a data bit transition is seen on CCDL 14. This may be accomplished by comparing the previously sampled data with the currently sampled data. If the data differs, then a data bit transition has been detected. If a data bit transition has been detected, then method 50 proceeds to step 58. If a data bit transition has not been detected, then method 50 proceeds to step 60.

At step 58, it is determined at which counter iteration the data bit transition was seen. If the counter is currently equal to one, then the transition was seen one iteration earlier than expected, and method 50 proceeds to step 62. If the counter is currently equal to two, then the bit transition was seen at the expected iteration, and method 50 proceeds to step 66. If the counter is currently equal to three, then the transition was seen one iteration later than expected, and method 50 proceeds to step 64.

At step 62, the data bit transition was seen early, and it is determined if the previous data bit transition was also seen early. This may be determined, for example, by setting an indicator within FPGA 16a indicative of a previously seen early data bit. If the previous data bit was seen early, then method 50 proceeds to step 68. At step 68, PLL 24a updates the end-count value for counter 22a by subtracting one iteration. If the previous data bit was not seen early, then method 50 proceeds to step 66. An indicator, such as a data bit stored in FPGA 16a, is set to indicate that an early data bit transition was seen.

At step 64, the data bit transition was seen late, and it is determined if the previous data bit transition was also seen late. This may be determined, for example, by setting an indicator within FPGA 16a indicative of a previously seen late data bit. If the previous data bit was seen late, then method 50 proceeds to step 70. At step 70, PLL 24a updates the end-count value of counter 22a by adding one iteration. If the previous data bit was not seen late, then method 50 proceeds to step 66. An indicator, such as a data bit stored in FPGA 16a, is set to indicate that a late data bit transition was seen.

At step 66, the data seen for the data bit transition is recorded. The data bit is recorded as a "logic one" or "logic zero" depending upon the chosen data encoding for the data communicated on CCDL 14. At step 60, it is determined whether or not counter 22a is on its final iteration by comparing the current iteration to the end-count value. If it is, then method 50 returns to step 52 and resets the counter to zero and the end-count value to five for the next data bit. If counter 22a is not on its final iteration, then method 50 proceeds to step 72 and the counter is moved to the next iteration for the next clock cycle. Method 50 then returns to step 54 to sample data for the next iteration. Method 50 continues for the duration data transmission on CCDL 14. Although not shown, it is understood that detection of a sync pattern such as the one illustrated in FIG. 2 may be included within method 50.

Discussion of Possible Embodiments

The following are non-exclusive descriptions of possible embodiments of the present invention.

A data communication system includes, among other things: a first unit that receives edge-encoded data from a data link. The first unit includes, among other things: a first counter, a first data bit reader, and a first phase-locked loop. The first counter counts at a sampling frequency from a minimum value to an end-count value. The first data bit reader is connected to receive the edge-encoded data. The first data bit reader samples the edge-encoded data at the sampling frequency to detect data bits of the edge-encoded data. The first phase-locked loop updates the end-count value if consecutive bits of the data bits are detected prior to an expected iteration of the first counter, and updates the end-count value if consecutive bits of the data bits are detected later than the expected iteration of the first counter.

The system of the preceding paragraph can optionally include, additionally and/or alternatively, any one or more of the following features, configurations and/or additional components:

A further embodiment of the foregoing system, wherein the first phase-locked loop subtracts one iteration from the end-count value upon detection of consecutive data bits one iteration prior to the expected iteration.

A further embodiment of any of the foregoing systems, wherein the first phase-locked loop adds one iteration to the end-count value upon detection of consecutive data bits one iteration after the expected iteration.

A further embodiment of any of the foregoing systems, wherein the first counter loops for six iterations, and the expected iteration is the third iteration.

A further embodiment of any of the foregoing systems, wherein the edge-encoded data is Manchester encoded and includes a three bit sync pattern, thirty-two data bits, and a parity bit.

A further embodiment of any of the foregoing systems, further including a second unit that communicates with the first unit over the data link, wherein the second unit includes a second data bit reader, a second counter, and a second phase-locked loop, and wherein the first unit includes a first data transmitter for communicating edge-encoded data to the second unit, and wherein the second unit includes a second data transmitter for communicating the edge-encoded data to the first unit.

A method of receiving edge-encoded data communicated on a data link includes, among other things: incrementing a counter at a sampling frequency, wherein the counter counts from a minimum value to an end-count value; sampling data, using a data bit reader, at each iteration of the counter; detecting data bits, using the data bit reader, of the edge-encoded data; adjusting the end-count value using a phase-locked loop if two consecutive data bits are each detected at iterations earlier than an expected iteration of the counter; and adjusting the end-count value using the phase-locked loop if two consecutive data bits are detected at iterations later than the expected iteration of the counter.

The method of the preceding paragraph can optionally include, additionally and/or alternatively, any one or more of the following features, configurations and/or additional components:

A further embodiment of the foregoing method, wherein adjusting the end-count value using the phase-locked loop if two consecutive data bits are detected each at iterations earlier than the expected iteration comprises subtracting one iteration from the end-count value if the two consecutive data bits are each detected one iteration earlier than the expected iteration.

A further embodiment of any of the foregoing methods, wherein adjusting the end-count value using the phase-locked loop if two consecutive data bits are each detected at iterations later than the expected iteration comprises adding one iteration to the end-count value if the two consecutive data bits are each detected one iteration later than the expected iteration.

A further embodiment of any of the foregoing methods, wherein the edge-encoded data is Manchester encoded and includes a three bit sync pattern, thirty-two data bits, and a parity bit.

A further embodiment of any of the foregoing methods, wherein incrementing the counter comprises, for each data bit, looping the counter every six iterations, and wherein the expected iteration of the counter is the third iteration of each loop.

While the invention has been described with reference to an exemplary embodiment(s), it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment(s) disclosed, but that the invention will include all embodiments falling within the scope of the appended claims.

The invention claimed is:

1. A data communication system comprising:
    a first unit that receives edge-encoded data from a data link, wherein the first unit comprises:
        a first counter that counts at a sampling frequency from a minimum value to an end-count value;
        a first data bit reader connected to receive the edge-encoded data, wherein the first data bit reader samples the edge-encoded data at the sampling frequency to detect data bits of the edge-encoded data; and
        a first phase-locked loop that updates the end-count value if consecutive bits of the data bits are detected prior to an expected iteration of the first counter, and that updates the end-count value if consecutive bits of the data bits are detected later than the expected iteration of the first counter, wherein the first phase-locked loop subtracts one iteration from the end-count value upon detection of consecutive data bits one iteration prior to the expected iteration.

2. The system of claim 1, wherein the first phase-locked loop adds one iteration to the end-count value upon detection of consecutive data bits one iteration after the expected iteration.

3. The system of claim 1, wherein the first counter loops for six iterations, and the expected iteration is the third iteration.

4. The system of claim 1, wherein the edge-encoded data is Manchester encoded and includes a three bit sync pattern, thirty-two data bits, and a parity bit.

5. The system of claim 1, further comprising a second unit that communicates with the first unit over the data link, wherein the second unit includes a second data bit reader, a second counter, and a second phase-locked loop, and wherein the first unit includes a first data transmitter for communicating edge-encoded data to the second unit, and wherein the second unit includes a second data transmitter for communicating the edge-encoded data to the first unit.

6. The system of claim 1, wherein the first unit further comprises a field programmable gate-array, and wherein the field programmable gate-array comprises the first data bit reader, the first counter, the first phase-locked loop, and an internal memory that stores the edge-encoded data.

7. A method of receiving edge-encoded data communicated on a data link, the method comprising:
incrementing a counter at a sampling frequency, wherein the counter counts between a minimum value and an end-count value;
sampling data, using a data bit reader, at each iteration of the counter;
detecting data bits, using the data bit reader, of the edge-encoded data;
adjusting the end-count value using a phase-locked loop if two consecutive data bits are each detected at iterations earlier than an expected iteration of the counter; and
adjusting the end-count value using the phase-locked loop if two consecutive data bits are detected at iterations later than the expected iteration of the counter by adding one iteration to the end-count value if the two consecutive data bits are each detected one iteration later than the expected iteration.

8. The method of claim 7, wherein adjusting the end-count value using the phase-locked loop if two consecutive data bits are detected each at iterations earlier than the expected iteration comprises subtracting one iteration from the end-count value if the two consecutive data bits are each detected one iteration earlier than the expected iteration.

9. The method of claim 7, wherein the edge-encoded data is Manchester encoded and includes a three bit sync pattern, thirty-two data bits, and a parity bit.

10. The method of claim 7, wherein incrementing the counter comprises, for each data bit, looping the counter every six iterations, and wherein the expected iteration of the counter is the third iteration of each loop.

11. A data communication system comprising:
a first unit that receives edge-encoded data from a data link, wherein the first unit comprises:
a first counter that counts at a sampling frequency from a minimum value to an end-count value;
a first data bit reader connected to receive the edge-encoded data, wherein the first data bit reader samples the edge-encoded data at the sampling frequency to detect data bits of the edge-encoded data;
a first phase-locked loop that updates the end-count value if consecutive bits of the data bits are detected prior to an expected iteration of the first counter, and that updates the end-count value if consecutive bits of the data bits are detected later than the expected iteration of the first counter; and
a first data transmitter; and
a second unit that communicates with the first unit over the data link, wherein the second unit comprises:
a second data bit reader;
a second counter;
a second phase-locked loop; and
a second data transmitter for transmitting edge-encoded data to the first unit, and wherein the first data transmitter is configured to communicate edge-encoded data to the second unit.

12. The system of claim 11, wherein the first phase-locked loop subtracts one iteration from the end-count value upon detection of consecutive data bits one iteration prior to the expected iteration.

13. The system of claim 11, wherein the first phase-locked loop adds one iteration to the end-count value upon detection of consecutive data bits one iteration after the expected iteration.

14. The system of claim 11, wherein the first counter loops for six iterations, and the expected iteration is the third iteration.

15. The system of claim 11, wherein the edge-encoded data is Manchester encoded and includes a three bit sync pattern, thirty-two data bits, and a parity bit.

16. The system of claim 11, wherein the first unit further comprises a field programmable gate-array, and wherein the field programmable gate-array comprises the first data bit reader, the first counter, the first phase-locked loop, and an internal memory that stores the edge-encoded data.

* * * * *